United States Patent
Moosburger et al.

(10) Patent No.: US 10,903,392 B2
(45) Date of Patent: Jan. 26, 2021

(54) METHOD OF PRODUCING OPTOELECTRONIC SEMICONDUCTOR COMPONENTS AND OPTOELECTRONIC SEMICONDUCTOR COMPONENT

(71) Applicant: OSRAM Opto Semiconductors GmbH, Regensburg (DE)

(72) Inventors: Jürgen Moosburger, Lappersdorf (DE); Matthias Sabathil, Regensburg (DE); Frank Singer, Regenstauf (DE)

(73) Assignee: OSRAM OLED GmbH, Regensburg (DE)

( * ) Notice: Subject to any disclaimer, the term of this patent is extended or adjusted under 35 U.S.C. 154(b) by 72 days.

(21) Appl. No.: 16/090,635

(22) PCT Filed: Apr. 6, 2017

(86) PCT No.: PCT/EP2017/058266
§ 371 (c)(1),
(2) Date: Oct. 2, 2018

(87) PCT Pub. No.: WO2017/174730
PCT Pub. Date: Oct. 12, 2017

(65) Prior Publication Data
US 2019/0123238 A1    Apr. 25, 2019

(30) Foreign Application Priority Data

Apr. 8, 2016 (DE) .......................... 10 2016 106 493

(51) Int. Cl.
*H01L 33/02* (2010.01)
*H01L 27/15* (2006.01)
(Continued)

(52) U.S. Cl.
CPC ............ *H01L 33/025* (2013.01); *H01L 22/20* (2013.01); *H01L 27/156* (2013.01);
(Continued)

(58) Field of Classification Search
None
See application file for complete search history.

(56) References Cited

U.S. PATENT DOCUMENTS 7,435,999 B2    10/2008  Windisch et al.
2003/0111447 A1*  6/2003  Corkum ............... B23K 26/032
                                            219/121.69
(Continued)

FOREIGN PATENT DOCUMENTS

DE    10 2004 025 684 A1   11/2005
EP        1 596 442 A2     11/2005
(Continued)

*Primary Examiner* — Erik Kielin
(74) *Attorney, Agent, or Firm* — DLA Piper LLP (US)

(57) ABSTRACT

A method of producing optoelectronic semiconductor components, the method includes: a) providing a composite comprising a semiconductor layer sequence including an active region that generates or receives radiation; b) determining a position of at least one defect region of the semiconductor layer sequence; c) forming a plurality of electrically contactable functional regions that each include a part of the semiconductor layer sequence and are free of a defect region; and d) separating the composite into a plurality of optoelectronic semiconductor components that each include at least one of the functional regions.

12 Claims, 7 Drawing Sheets

(51) Int. Cl.
*H01L 21/66* (2006.01)
*H01L 33/00* (2010.01)
*H01L 33/38* (2010.01)
*H01L 33/50* (2010.01)

(52) U.S. Cl.
CPC ............ *H01L 33/005* (2013.01); *H01L 33/38* (2013.01); *H01L 33/382* (2013.01); *H01L 33/505* (2013.01)

(56) References Cited

U.S. PATENT DOCUMENTS

| | | | |
|---|---|---|---|
| 2005/0253155 A1* | 11/2005 | Wirth | H01L 33/62 257/88 |
| 2006/0192209 A1* | 8/2006 | Maeda | H01S 5/2201 257/79 |
| 2008/0211416 A1* | 9/2008 | Negley | H01L 25/0756 315/193 |
| 2010/0109575 A1* | 5/2010 | Ansems | H01L 27/156 315/312 |

FOREIGN PATENT DOCUMENTS

| | | |
|---|---|---|
| JP | 2001-007400 A | 1/2001 |
| WO | 01/54853 A2 | 8/2001 |
| WO | 2006/061728 A2 | 6/2006 |
| WO | 2016/116483 A1 | 7/2016 |
| WO | 2016/116506 A1 | 7/2016 |

* cited by examiner

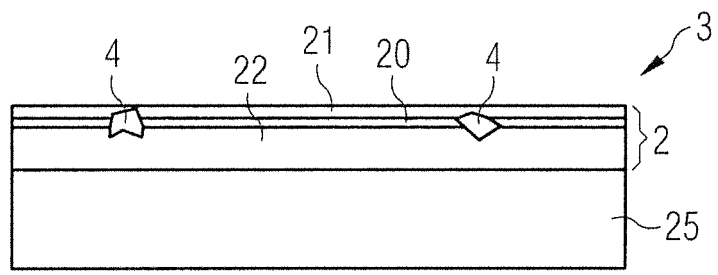
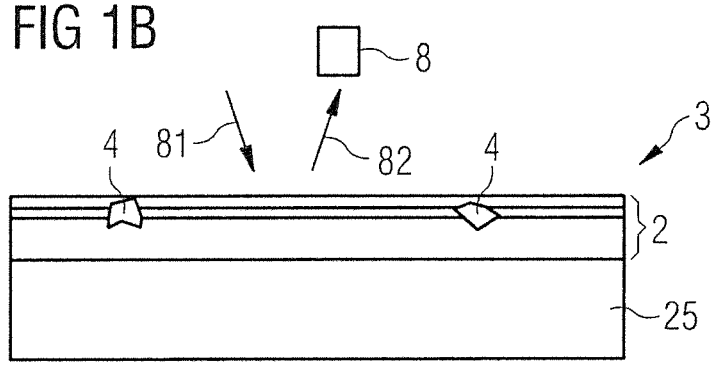
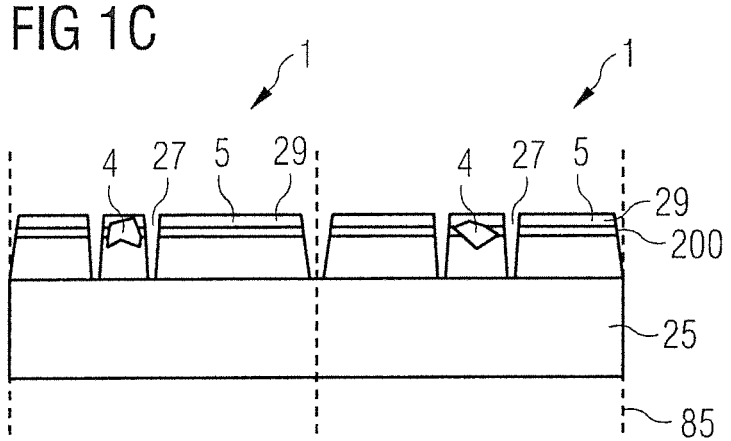

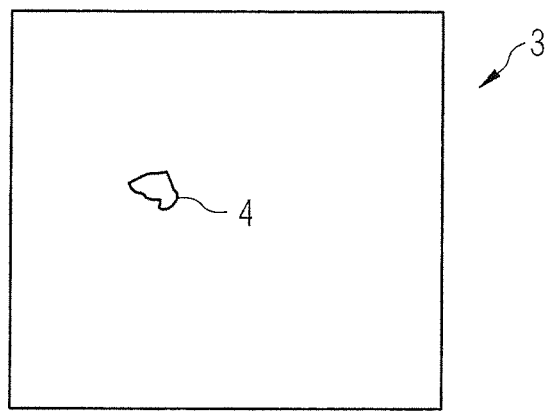
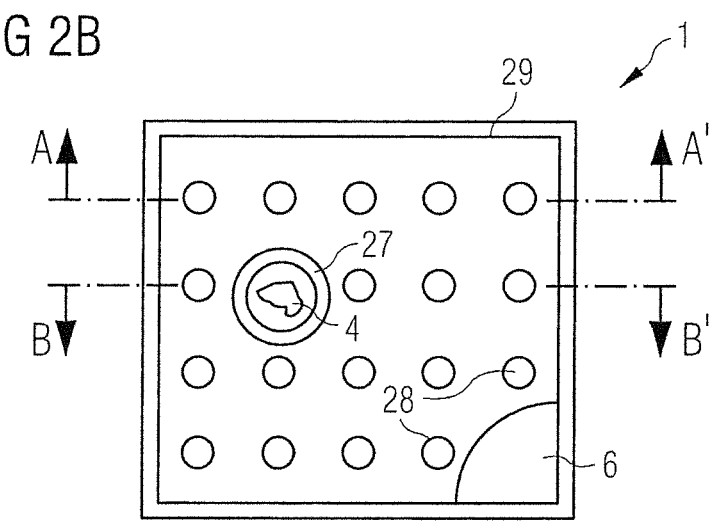
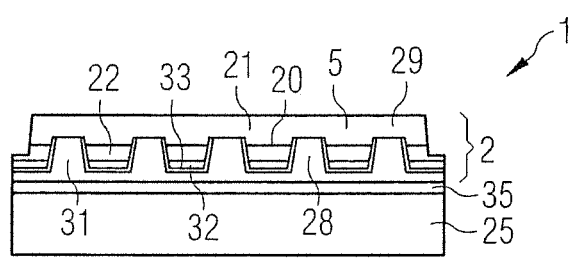
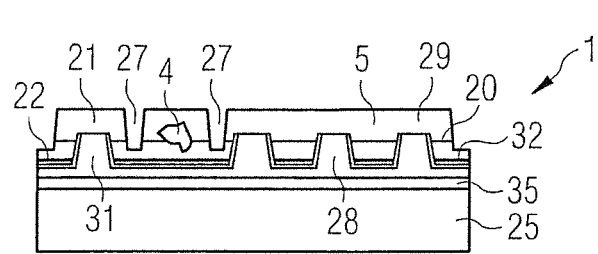

US 10,903,392 B2

METHOD OF PRODUCING OPTOELECTRONIC SEMICONDUCTOR COMPONENTS AND OPTOELECTRONIC SEMICONDUCTOR COMPONENT

TECHNICAL FIELD

This disclosure relates to a method of producing optoelectronic semiconductor components and an optoelectronic semiconductor component.

BACKGROUND

In optoelectronic semiconductor chips such as, for example, light-emitting diodes, crystal defects can, for example, lead to the light-emitting diodes not being functional. In particular, in modules comprising a plurality of optoelectronic semiconductor chips, depending on the requirements, a single defective semiconductor chip can already render the entire module with several hundreds of semiconductor chips unusable. This relates, for example, to video walls in which the semiconductor chips are arranged at a very small distance so that it is not easily possible to replace a defective semiconductor chip.

It could therefore be helpful to reduce the failure rate during the production of optoelectronic semiconductor components.

SUMMARY

We provide a method of producing optoelectronic semiconductor components, the method including a) providing a composite including a semiconductor layer sequence including an active region that generates or receives radiation; b) determining a position of at least one defect region of the semiconductor layer sequence; c) forming a plurality of electrically contactable functional regions that each include a part of the semiconductor layer sequence and are free of a defect region; and d) separating the composite into a plurality of optoelectronic semiconductor components that each include at least one of the functional regions.

We also provide an optoelectronic semiconductor component including a semiconductor body including a semiconductor layer sequence having an active region that generates or receives radiation, wherein the semiconductor body includes a functional region and a defect region; and the active region of the defect region is electrically isolated from the active region of the functional region on at least one side of the active region.

We further provide a method of producing optoelectronic semiconductor components including a) providing a composite including a semiconductor layer sequence including an active region that generates or receives radiation; b) determining a position of at least one defect region of the semiconductor layer sequence; c) forming a plurality of electrically contactable functional regions that each include a part of the semiconductor layer sequence and are free of a defect region; and d) separating the composite into a plurality of optoelectronic semiconductor components that each include at least one of the functional regions, wherein at least two of the functional regions formed in step c), that are each adjacent to the position of a defect region, differ from one another with respect to their geometric configuration.

BRIEF DESCRIPTION OF THE DRAWINGS

FIGS. 1A, 1B and 1C show an example of a method of producing optoelectronic semiconductor components on the basis of intermediate steps schematically illustrated in a cut-away view.

FIG. 2A shows an example of a detail of a composite in a schematic plan view and an example of a semiconductor component, which is formed with the detail, on the basis of a schematic plan view (FIG. 2B) and two schematic cut-away views along the lines AA' shown in FIG. 2B and BB' in FIGS. 2C and 2D.

FIGS. 6A to 6F show an example of a semiconductor component in a plan view (FIG. 6A) and associated cut-away views (FIGS. 6B and 6C), wherein FIG. 6D shows a substructure according to a target grid and FIGS. 6E and 6F show two examples for a substructure deviating from the target grid.

Figure 3A:
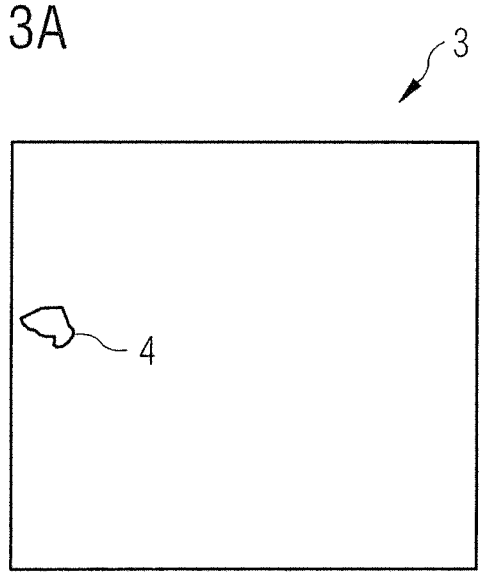
FIG. 3A shows an example of a detail of a composite.

REFERENCE NUMERALS 1 optoelectronic semiconductor component
2 semiconductor layer sequence
20 active region
200 outer border
21 first semiconductor layer
22 second semiconductor layer
25 carrier
27 recess
28 plated-through hole
29 semiconductor body
3 composite
31 first connection layer
32 second connection layer
33 insulating layer
35 connecting layer
4 defect region
5 functional region
6 contact area
61 contact web
62 upper-side contact
63 rear-side contact
7 image point
70 substructure
7R sub-region
7G sub-region
7B sub-region
71 first radiation conversion element
72 second radiation conversion element
75 target grid
8 detector
81 arrow
82 arrow
85 separating line

DETAILED DESCRIPTION

We provide a method of producing optoelectronic semiconductor components.

Our method may comprise a step in which a composite comprising a semiconductor layer sequence is provided. The semiconductor layer sequence comprises an active region that generates or receives radiation. For example, a peak wavelength of the radiation lies in the ultraviolet, visible or infrared spectral range.

For example, the semiconductor layer sequence is provided on a carrier. The carrier can be a growth substrate for the semiconductor layer sequence or a carrier different from the growth substrate.

The method may comprise a step in which a position of one or more defect regions of the semiconductor layer sequence is determined. In other words, a spatially resolved determination of defect regions takes place within the composite.

A defect region means a region in which the semiconductor layer sequence does not satisfy the predetermined properties and can in particular lead thereto, that a semiconductor component with this defect region, the semiconductor component being formed from the semiconductor layer sequence, would not be functional, or would be functional only to a limited extent. The defect region is, for example, an epitaxial defect, at which a non-radiative recombination or an electrical short-circuit takes place.

In particular, the entire area to be used of the composite is monitored for defect regions. The position of the at least one defect region is expediently stored and kept available for the further method steps.

The method may comprise a step in which a plurality of electrically contactable functional regions is formed. The functional regions each comprise a part of the semiconductor layer sequence and are free of a defect region. In particular, the functional regions each comprise a part of the active region. This step is carried out in particular after determination of the position of the at least one defect region so that the position of the at least one defect region can be taken into account for the spatial arrangement of the functional regions.

The method may comprise a step in which the composite is singulated into a plurality of optoelectronic semiconductor components, wherein the optoelectronic semiconductor components each comprise at least one of the functional regions. This step is carried out in particular after determination of the position of the at least one defect region and after formation of the electrically contactable functional regions.

A composite comprising a semiconductor layer sequence may be provided, wherein the semiconductor layer sequence comprises an active region that generates or receives radiation. A position of one or more defect regions of the semiconductor layer sequence is determined. A plurality of electrically contactable functional regions is formed, wherein the functional regions each comprise a part of the semiconductor layer sequence and are free of a defect region. The composite is singulated into a plurality of optoelectronic semiconductor components, wherein the semiconductor components each comprise at least one of the functional regions.

By the method, defect regions can be detected in an early stage of the method and the defect regions can already be taken into account for formation of the functional regions. In particular, the functional regions can be formed while bypassing the defect regions so that small defect regions on the composite do not represent a failure reason for a finished semiconductor component. In other words, defect regions can be excluded during formation of the functional regions by a structuring adapted to the position of the defect regions for each composite. This increases the yield in production of semiconductor components. The greater the lateral extent of the individual semiconductor component, the greater the improvement in the yield.

At least two of the formed functional regions, each adjacent to the position of a defect region, may differ from one another with respect to their geometric configuration. For example, the functional regions may differ from one another in plan view of the composite with respect to their area and/or with respect to their basic geometrical shape. For example, two functional regions have a polygonal shape in which at least two internal angles differ from one another, for example, by at least 5°. In particular, functional regions can differ from one another with respect to their area and/or with regard to their basic geometrical shape, although they basically satisfy the same technical function, that is to say, for example, generation or reception of radiation of a specific wavelength.

At least one of the singulated semiconductor components may comprise one of the defect regions, wherein during operation of the semiconductor component, a current flows within the semiconductor component, and the position of the defect region is circumvented. In other words, the defect region is electrically deactivated so that the semiconductor component is also functional in the presence of a defect region. The yield during production of the semiconductor components can thus be further increased.

The active region may be removed in the at least one defect region or the active region may be electrically isolated from the active region of an adjoining functional region, in particular from all adjacent functional regions, on at least one side of the active region. For example, the active region is electrically insulated on an n-conducting side of the active region and/or on a p-conducting side of the active region. In other words, charge carriers having a different conduction type, that is to say electrons and holes, can not get into the active region from opposite sides of the active region during operation of the semiconductor component and can not recombine there with emission of radiation. Thus, it is ensured in a simple manner that the active region in the defect region has no negative influence on the functional capability of the semiconductor component.

The active region may be structured or patterned laterally during formation of the plurality of electrically contactable functional regions so that the active region in the at least one defect region is spatially separated from the active region of an adjoining functional region. This is effected, for example, by a recess in particular in the form of a trench surrounding the defect region at least in places in a lateral direction. In particular, a part of the particularly trench-shaped recess is located on each imaginary connecting line between the defect region and the adjoining functional region so that there is no direct connection between the active region of the adjoining functional region and the active region of the defect region.

The spatial separation of the defect region from the functional region and a formation of an outer border of the active region of the semiconductor component may take place in a common production step. The outer border in this case indicates the circumferential boundary of the active region in the lateral direction. Thus, there is no part of the active region of the semiconductor component located outside the outer border. The spatial separation of the defect region can thus be effected without an additional structuring step, for example, an additional etching step.

For external electrical contacting, the semiconductor components expediently each comprise at least one electrical contact area.

The contact area may be formed as a function of the determined position of the at least one defect region such that the contact area overlaps with the defect region. Thus, a region of the semiconductor component can be employed to form the defect region, the active region of which would not be usable to generate radiation or receiving radiation.

The at least one defect region may be determined by a measurement of a radiation emission under an optical excitation, for example, by a spatially resolved photoluminescence measurement. With such a method, defect regions can be determined in a simple and reliable manner in a spatially resolved manner and in particular also in an automatable manner, in particular defect regions at which no luminescence takes place during optical excitation. In particular, defect regions can already be identified even before metallic contact structures for the electrical contacting are applied to the semiconductor layer sequence. In principle, however, any other method is also suitable to determine the defect regions by which defect regions can be identified in a spatially resolved manner, for example, by an automated optical inspection.

The semiconductor components may each comprise a plurality of image points, wherein at least one image point comprises a substructure having a plurality of sub-regions. For example, a first portion of the sub-regions is formed to generate radiation of a first color and a second portion of the sub-regions is formed to generate radiation of a second color different from the first color. For example, each image point comprises one or more sub-regions to generate radiation in the red spectral range, one or more sub-regions to generate radiation in the green spectral range and/or one or more sub-regions to generate radiation in the blue spectral range.

The substructure may be designed in dependence of the determination of the at least one defect region such that the sub-regions are free of a defect region. In other words, the defect region is bypassed for configuration of the sub-regions on the basis of the determined position of the at least one defect region.

The substructure may be different for at least two image points. For example, the shape of the individual sub-regions determined by an automated data processing method on the basis of the determined position of the at least one defect region is individually adapted for each image point, the position of which overlaps with the position of a defect region such that all sub-regions of the image point are arranged without overlap with the defect region.

A first portion of the sub-regions to generate radiation of a first color and a second portion of the sub-regions to generate radiation of a second color different from the first color may be formed in each image point, wherein the substructure is varied in each image point, which overlaps with a defect region, while maintaining an area ratio of the total area of the first portion to the total area of the second portion. The substructure is thus designed such that even in the event of a deviation in the size and/or in the shape of the sub-regions, the area ratio does not change or at least does not change significantly.

We also provide an optoelectronic semiconductor component.

The optoelectronic semiconductor component may comprise a semiconductor body comprising a semiconductor layer sequence. The semiconductor layer sequence comprises an active region that generates or receives radiation.

The semiconductor body may comprise a functional region and a defect region, wherein the active region of the defect region is electrically insulated from the active region of the functional region.

The optoelectronic semiconductor component may comprise a semiconductor body having a semiconductor layer sequence. The semiconductor layer sequence comprises an active region that generates or receives radiation. The semiconductor body comprises a functional region and a defect region, wherein the active region of the defect region is electrically insulated from the active region of the functional region.

However, the defect region does not necessarily have to be present in the semiconductor component. Alternatively, it is also possible that the defect region is completely removed during production of the semiconductor component. For example, the semiconductor body comprises a recess at the position at which the defect region was originally located.

The semiconductor component may comprise a plurality of image points. At least one first image point and one second image point each comprise a substructure having a plurality of sub-regions. The substructure of the first image point differs from the substructure of the second image point. In particular, the substructure of an image point which overlaps with a defect region, differs from the substructure of an image point without a defect region and/or from the substructure of a further image point with a defect region. In particular, the image points are individually segmented by the substructure such that defect regions remain left out and have no effect on the rest of the semiconductor component.

The individual sub-regions can be different from one another with respect to their size and/or with respect to their basic geometrical shape. In particular, the image points and the substructure can also be designed such that the resulting image points are slightly smaller or larger than in a corresponding conventional pattern in which defect regions are not taken into account. As a result of the individual adaptation of the substructure, this can be effected such that the color impression and brightness impression of each image point are left stable and unchanged to the greatest possible extent.

Alternatively or in addition, individual sub-regions can be designed such that they can be operated with different currents. As a result, a predetermined target color locus and/or a predetermined target brightness of the image point can also be achieved in the presence of a defect region.

A first portion of the sub-regions that generates radiation of a first color and a second portion of the sub-regions that generates radiation of a second color different from the first color may be formed in each image point and the substructure of the first image point and the substructure of the second image point may be designed such that a total area of the first portion of the first image point and a total area of the first portion of the second image point differ from each other by at most 10%. A uniform color impression/or brightness impression of the image points can thus be achieved in a simplified manner.

The method described is particularly suitable for producing the optoelectronic semiconductor component described. Features described in connection with the method can therefore also be used for the optoelectronic semiconductor component and vice versa.

Further advantages result from the following description of the examples in conjunction with the figures.

Identical, similar or identically acting elements are provided with the same reference numerals in the figures.

The figures are each schematic representations and therefore not necessarily to scale. Rather, comparatively small elements and in particular layer thicknesses can be represented exaggeratedly large for clarification.

In FIGS. 1A to 1C a method of producing optoelectronic semiconductor components is shown.

A composite 3 comprising a semiconductor layer sequence 2 is provided (FIG. 1A). For a simplified illustration, a sub-region of the composite is shown, from which two semiconductor components 1 are produced during the subsequent singulation.

The semiconductor layer sequence 2 comprises an active region 20 that generates or receives radiation. The active region 20 is arranged between a first semiconductor layer 21 of a first conductivity type and a second semiconductor layer 22 of a second conductivity type different from the first conductivity type. For example, the first semiconductor layer 21 is p-conducting and the second semiconductor layer 22 is n-conducting or vice versa.

The semiconductor layer sequence 2 is arranged on a carrier 25. The carrier 25 can be a growth substrate for the in particular epitaxial deposition of the semiconductor layer sequence 2 or a carrier different from the growth substrate.

As illustrated in FIG. 1B, a position of defect regions 4 is determined. This is done, for example, by an optical excitation, represented by an arrow 81, that effects an emission radiation of the active region 20, represented by an arrow 82. This emission radiation is detected by a detector 8. Areas of the composite 3 at which no emission radiation or at least an only greatly reduced emission radiation is emitted are identified as defect regions. The position of the defect regions 4 is saved. For determination of the position of the defect regions, the, for example, optical excitation can be effected over a large area or only locally. In a large-area excitation, for example, a camera with an objective can serve as a detector 8 so that the emission radiation is detected in a spatially resolved manner and thus the positions of the defect regions are determined. In a local excitation, a detector 8 is sufficient which itself does not provide spatially resolved information about the emission radiation, in conjunction with information about the position of the optical excitation.

A plurality of electrically contactable functional regions 5 is subsequently formed from the semiconductor layer sequence 2. The functional regions 5 are formed on the basis of the determined positions of the defect regions 4 so that the functional regions 5 are each formed without overlap with the defect regions 4 (FIG. 1C). The functional regions 5 are thus each free of a defect region. The determination of a suitable geometry and/or size of the functional regions 5, that is to say a lateral structuring of the semiconductor layer sequence, can be carried out by an automated process.

The determined lateral structuring can be introduced, for example, by a laser into a photoresist layer applied to the semiconductor layer sequence 2 (not explicitly shown in FIG. 1C). For example, a so-called LDI (Laser direct imaging) method is suitable. The structure of the photoresist layer can subsequently be transferred by a chemical method, for example, a wet chemical or dry chemical etching method into the semiconductor layer sequence 2. As an alternative to the exposure of a photoresist layer, the material of the semiconductor layer sequence can be removed directly by laser ablation for lateral structuring.

The lateral structuring transferred into the semiconductor layer sequence 2 can thus be individually adapted in the knowledge of the position of the defect regions 4 for each composite 3 to be structured laterally. As a result, defect regions can be bypassed during production of the functional regions 5. The yield during production is increased in this way. In contrast to this, in a conventional production method for the lateral structuring, a photomask is typically employed to expose the photoresist layer, wherein the same photomask is used successively for several composites 3. Functional regions that overlap with a defect region in such a conventional process, are not functional and typically lead to the failure of the entire semiconductor component.

As shown in FIG. 1C, the active region 20 of the defect region 4 is spatially separated from the active region of the adjoining functional region 5 by a recess 27. The recess 27 severs at least the active region 20 and can also completely sever the semiconductor layer sequence 2. During the later electrical contacting of the semiconductor component 1, a current flow takes place within the semiconductor component during operation of the semiconductor component, in particular within the semiconductor layer sequence 2, while bypassing the defect region 4 so that also a semiconductor component 1 comprising a defect region 4 is functional.

Formation of the recesses 27 can be effected with formation of an outer border 200 of the active region 20 in a common production step. Thus, no additional process step, in particular no additional etching method, is required for the spatial separation of the defect regions 4.

The composite 3 can subsequently be singulated into a plurality of optoelectronic semiconductor components 1 so that each semiconductor component comprises at least one of the functional regions 5. This is indicated in FIG. 1C by separating lines 85.

The method is suitable for producing various optoelectronic semiconductor components, for example, as described in connection with the following figures. In particular, an optoelectronic semiconductor component 1 can also comprise more than one functional region 5. For example, the semiconductor component can comprise a plurality of image points, wherein an image point or a sub-region of an image point can represent a functional region.

An example of a semiconductor component is shown in FIGS. 2B to 2D, wherein FIG. 2A shows an associated section of a composite 3 from which the semiconductor component 1 emerges during production. For a simplified illustration, the composite 3 shows exactly one defect region 4. During production of the optoelectronic semiconductor component 1, the semiconductor layer sequence 2 is structured laterally such that a recess 27 spatially separates the active region 20 of the defect region 4 from the active region 20 of the adjoining functional region 5. The recess 27 surrounds the active region 20 in the shape of a ring.

The optoelectronic semiconductor component 1 comprises a semiconductor body 29 comprising a semiconductor layer sequence 2. The semiconductor layer sequence is attached to a carrier 25 that is different from a growth substrate for the semiconductor layer sequence 2 by a connecting layer 35. For example, the connecting layer is a solder layer or an adhesive layer.

A second semiconductor layer 22 arranged on the side of the active region 20 facing the carrier 25 electrically conductively connects to a second connection layer 32 for an electrical contacting. The second connection layer can preferably additionally also have the function of a mirror layer. An external electrical contact of the second connection layer 32 is effected via a contact area 6. This contact area is arranged on the side of the carrier 25 facing the semiconductor body 29. To avoid shading, the contact area is arranged laterally of the semiconductor body 29.

An electrical contacting of a first semiconductor layer 21 arranged on the side of the active region 20 facing away from the carrier 25 is effected in the functional region 5 via plated-through holes 28 that extend through the second semiconductor layer 22 and the active region 20 into the first semiconductor layer 21 (FIG. 2C). A first connection layer 31 that electrically contacts the first semiconductor layer 21 runs through the plated-through holes 28. In a vertical direction, that is to say perpendicular to a main plane of extension of the semiconductor layers of the semiconductor layer sequence 2, the second connection layer 32 is arranged in regions between the semiconductor body 29 and the first connection layer 31. To avoid an electrical short circuit, an insulation layer 33 is arranged in the plated-through holes 28, which electrically isolates the first connection layer 31 from the active region 20 and from the second semiconductor layer 22.

In contrast to the functional region 5, the defect region 4 is free of a plated-through hole 28. As a result, during operation of the optoelectronic semiconductor component 1, no charge carriers can be injected into the active region 20 via the first semiconductor layer 21. Even in a configuration of the second connection layer 32 continuously over the second semiconductor layer 22 of the defect region, the defect region 4 is thus electrically inactive during operation of the optoelectronic semiconductor component 1. During production of the semiconductor component, the spatial arrangement of the plated-through holes is thus individually adapted to the determined position of the defect regions 4.

As an alternative, a plated-through hole 28 can also be provided in the defect region 4. In this case, the second connection layer 32 can be cut out in the defect region so that no charge carriers are injected into the active regions 20 via the second semiconductor layer 22 and the defect region 4 is electrically inactive during operation of the optoelectronic semiconductor component 1. In this alternative, the second connection layer 32 is thus formed in the knowledge of the position of the defect regions 4 such that the defect regions are electrically inactive.

Figure 3B:
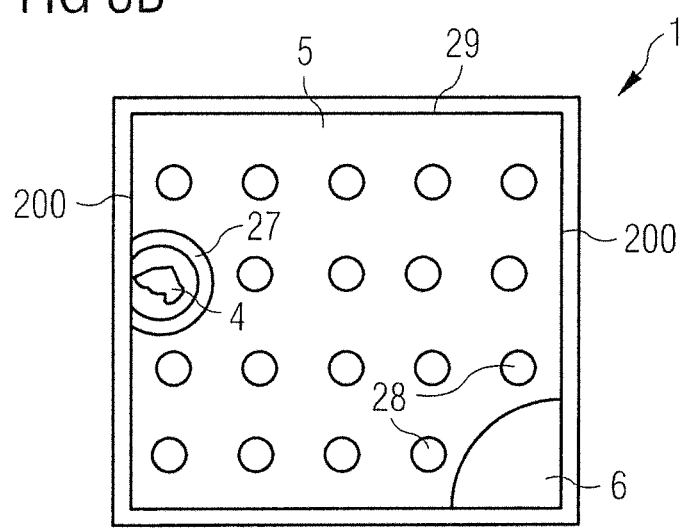
FIG. 3B shows an example of a semiconductor component formed with the detail, in each case in a schematic plan view.

The example shown in FIGS. 3A and 3B for an optoelectronic semiconductor component 1 and a composite 3 on which the optoelectronic semiconductor component is based essentially corresponds to the example described in connection with FIGS. 2A and 2B.

In contrast, the defect region 4 is arranged in an edge region of the semiconductor body 29. In this case, the recess 27 extends only in regions around the defect region 4 and runs in a lateral direction up to the outer border 200 of the active region 20, for example, in the shape of half a ring. Of course, a defect region can also be located in a corner of the semiconductor body so that the recess can have the shape of a quarter of a ring, for example.

Figure 4A:
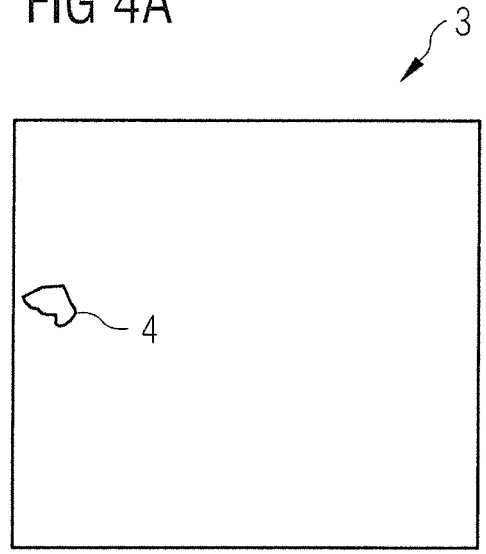
FIG. 4A shows an example of a detail of a composite.
Figure 4B:
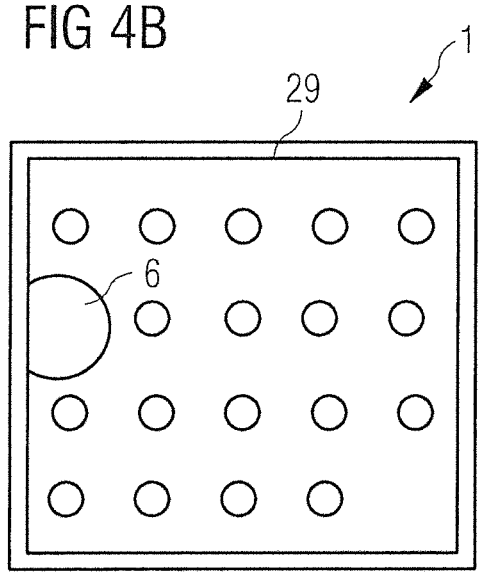
FIG. 4B shows an example of a semiconductor component formed with the detail, in each case in a schematic plan view.

The example illustrated in FIGS. 4A and 4B for an optoelectronic semiconductor component 1 and a composite 3 on which the optoelectronic semiconductor component is based essentially corresponds to the example described in connection with FIGS. 3A and 3B.

In contrast, the contact area 6 is arranged such that it overlaps with the defect region 4. The contact area is thus arranged in a region of the semiconductor component 1, which would not be suitable for generating radiation or receiving radiation due to the existing defect region 4. The area of the active region 20 that can be used for the semiconductor component 1 can thus be enlarged for a constant extent of the semiconductor component. In this case, positioning of the contact area thus takes place on the basis of the position of the defect region determined during production. The individually adapted arrangement of the contact area can be effected, for example, by an LDI method. To further process such a semiconductor component having a contact area displaced in this way, for example, to electrical contact in a housing, can also be effected, for example, by a wiring that employs an LDI method.

A further example for an optoelectronic semiconductor component 1 and a composite 3 on which the semiconductor component is based is shown in FIGS. 5A to 5D. This example corresponds essentially to the example described in connection with FIGS. 2A to 2D. In contrast, the electrical contacting of the first semiconductor layer 21 arranged on the side of the active region 20 facing away from the carrier 25 takes place via a contact area 6 arranged on the first semiconductor layer. To improve homogeneity of the charge carrier injection in the lateral direction, contact webs 61 are connected to the contact area. In the region of the defect region 4, however, the first semiconductor layer 21 is not electrically connected to the contact area 6 so that the defect region 4 is electrically inactive.

During production of the optoelectronic semiconductor component, the defect region 4 can be spatially separated from the functional region 5 as described in connection with FIG. 1C. This can be effected in particular with the arrangement of the outer border 200 of the active region 20 in a common production step. This can be carried out in particular after the semiconductor layer sequence 2 has been transferred from an original growth substrate to the carrier 25, for example, by rebonding at wafer level.

Figure 5A:
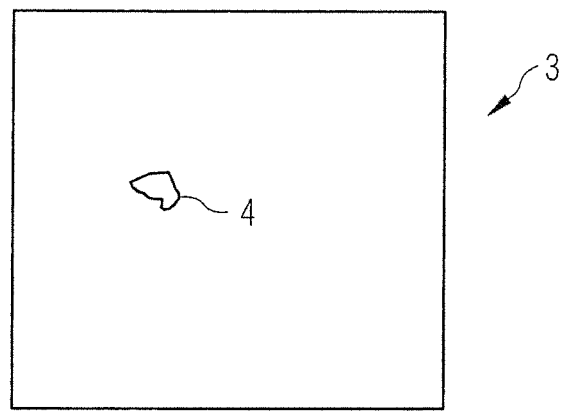
FIG. 5A shows an example of a detail of a composite in a schematic plan view and an example of a semiconductor component formed with the detail, on the basis of a schematic plan view (FIG. 5B) and two schematic cut-away views along the lines AA' shown in FIG. 5B and BB' in FIGS. 5C and 5D.
Figure 5B:
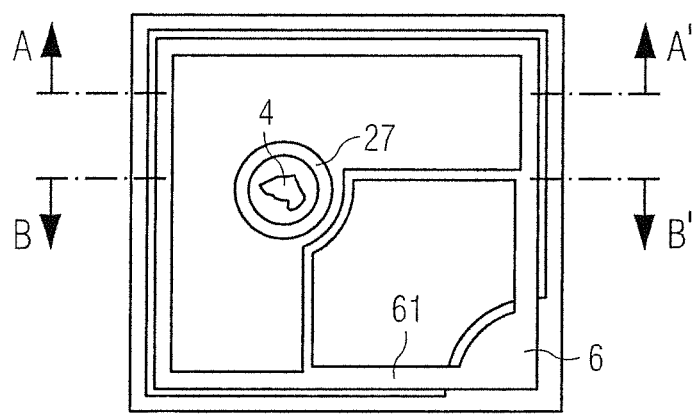
Figure 5C:
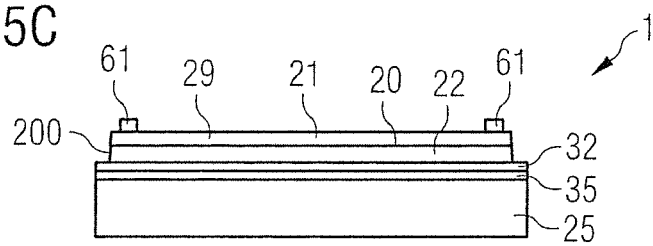
Figure 5D:
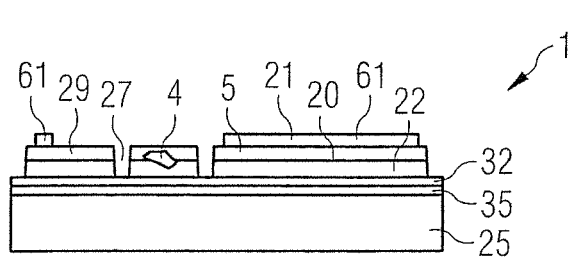

If necessary, configuration of the contact webs 61 can also be selected such that the contact webs are formed without an overlap with the defect region 4 so that the latter is not electrically contacted. This is shown in FIG. 5B on the basis of a contact web 61 that extends in regions along the recess 27 and thus avoids an electrical contacting of the defect region.

Figure 6A:
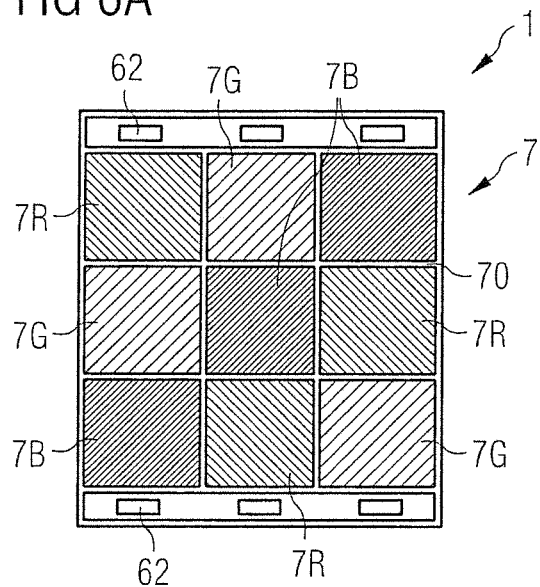
Figure 6B:
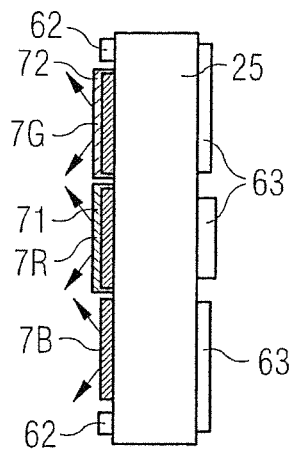
Figure 6C:
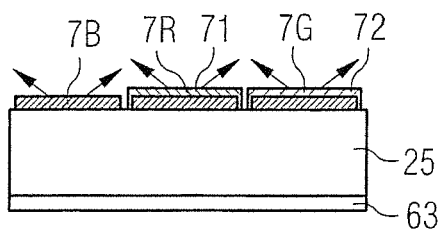

Examples for semiconductor components 1 are described with reference to FIGS. 6A to 6E, which comprise a plurality of functional regions 5 in the form of image points 7. FIG. 6A shows a schematic plan view of a basic arrangement according to a target grid in which two upper-side contacts 62 are each assigned to one row of image points 7 and a respective rear-side contact 63 is assigned to a column of image points 7 in each case. FIGS. 6B and 6C show associated side views. Each image point 7 comprises a sub-structure 70 with a plurality of sub-regions. A sub-region 7R is provided to generate radiation in the red spectral range. This sub-region comprises a first radiation conversion element 71 that converts primary radiation of the active region in the blue spectral range of the semiconductor component 1 into secondary radiation in the red spectral range. Correspondingly, a sub-region 7G is provided to generate radiation in the green spectral range. The sub-region comprises a second radiation conversion element 72 that converts primary radiation of the active region into secondary radiation in the green spectral range. A sub-region 7B is provided to generate radiation in the blue spectral range. A radiation conversion element is not required for this purpose. Each image point comprises one or more sub-regions 7R, one or more sub-regions 7G and one or more sub-regions 7B.

Deviating from the described example, it is also possible that the radiation conversion to generate red or green radiation is not arranged directly on the respective emission region. Furthermore, for example, the radiation in the blue spectral region can also be generated by a further radiation conversion element, for example, in a primary radiation of the active region in the ultraviolet spectral range. During production of the semiconductor component 1, the sub-regions of the image points emerge from a common semiconductor layer sequence.

Figure 6D:
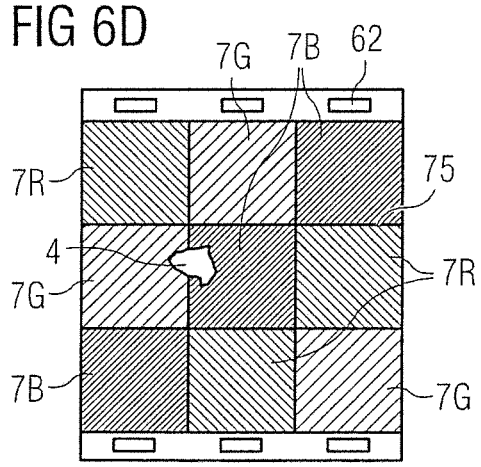

FIG. 6D shows an example in which a defect region 4, during formation of the substructure 70 according to a target grid 75, would lead to at least one sub-region, in the examples shown a sub-region 7G and a sub-region 7B, not being functional due to the defect region 4, as a result of which the entire semiconductor component 1 with a plurality of image points 7 would also be not usable.

Figure 6E:
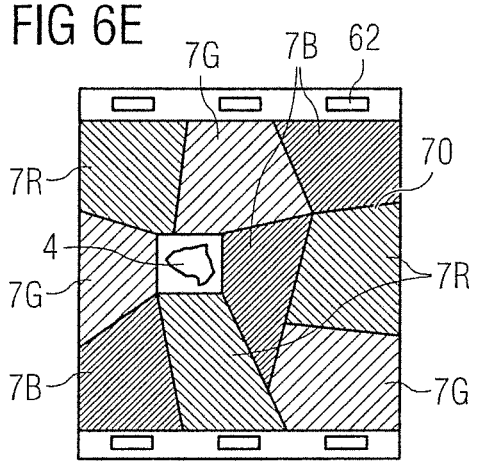
Figure 6F:
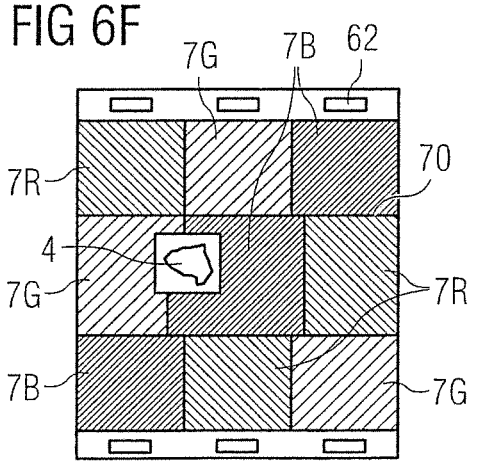

FIGS. 6E and 6F show two different variants of the substructure 70 that differ from the target grid 75, wherein the substructure is each designed such that the individual sub-regions 7R, 7G, 7B of the image points 7 are arranged without an overlap with the defect region 4. During production, as described in connection with FIGS. 1A to 1C, the positions of the defect regions 4 can be determined. In the knowledge of these positions, the sub-regions 7R, 7G, 7B adjoining a defect region can be individually designed differently from the target grid 75. In this case, the original area ratio of the target grid can be maintained. However, the sub-regions can also be formed somewhat smaller or larger than according to the original target grid. This can be carried out by an automated process that automatically creates an individual substructure 70 of the image points for each composite on the basis of the known positions of the defect regions.

This preferably takes place in a way that the brightness impression of each image point is left as stable and unchanged as possible. For this purpose, a variation of the basic shape and/or the size of the sub-regions 7R, 7G, 7B can be effected.

FIG. 6E shows an example in which the sub-regions 7R, 7G, 7B are varied in terms of their basic geometrical shape. The sub-regions each have a polygonal structure, wherein at least some inner angles have a value deviating from 90°. In particular, at least some internal angles are acute angles.

In the example shown in FIG. 6F, the internal angles in contrast to this are either 90° or 270°.

Deviating from the described examples, however, the shape of the individual sub-regions 7R, 7G, 7B can be varied within a wide range. For example, a border of a sub-region can also run in a partially curved manner.

In each image point, in each case a portion of the sub-regions 7R, 7G, 7B is provided to generate radiation in the red, green and blue spectral range. In the determination of the substructure 70, the deviation from the target grid 75 preferably takes place such that the area ratio of the individual components does not change or changes only slightly via the image points. A homogeneous color impression can thus be achieved in a simplified manner. For example, a total area of a first portion, that is to say, for example, sub-regions that generate radiation in the red, green or blue spectral region, of a first image point 7 and a corresponding total area of the first portion of a second image point 7 differ by at most 10% of one another.

For production of the semiconductor components 1, the target grid 75 can be selected such that low epitaxial area redundancies are provided such that a predetermined target brightness can also be achieved for each image point 7 in the presence of a defect region 4. The task of the area of the active region dropping out due to the defect regions can then be taken over by adjacent functional regions. As a result, a yield of almost 100% can be achieved.

In addition, the reduction of the failure frequency in the composite 3 to almost 0% in conjunction with a homogenization of the wavelength of the radiated radiation and the brightness of the individual sub-regions allows a parallel transfer of semiconductor components 1 in the form of semiconductor chips.

The production method makes it possible, in particular, to increase the yield during the production of semiconductor components 1, by spatially identifying defect regions 4 at an early stage of the method, in particular even before the lateral structuring of the active region 20. At least one subsequent production step is individually adapted for each composite 3 taking into account the position of the defect regions. In particular, the lateral structuring of the active region can be designed individually for each composite taking into account the position of the defect regions, in that the functional regions 5 are formed without an overlap with the defect regions 4. As a result, it can be achieved that the presence of a defect region does not or at least not significantly impair the functional capability of the semiconductor component.

Our methods and components are not restricted by description on the basis of the examples. Rather, this disclosure encompasses any new feature and also any combination of features that includes in particular any combination of features in the appended claims, even if the feature or combination itself is not explicitly specified in the claims or the examples.

This application claims priority of DE 10 2016 106 493.9, the subject matter of which is incorporated herein by reference.

The invention claimed is:

1. A method of producing optoelectronic semiconductor components, the method comprising:
   a) providing a composite comprising a semiconductor layer sequence comprising an active region that generates or receives radiation;
   b) determining a position of at least one defect region of the semiconductor layer sequence;
   c) forming a plurality of electrically contactable functional regions that each comprise a part of the semiconductor layer sequence and are free of a defect region; and
   d) separating the composite into a plurality of optoelectronic semiconductor components that each comprise at least one of the functional regions,
      wherein the semiconductor components comprise a plurality of image points and at least one image point comprises a substructure having a plurality of sub-regions, and
      a first portion of the sub-regions that generate radiation of a first color and a second portion of the sub-regions that generate radiation of a second color different from the first color are formed in each image point and the substructure is varied in each image point, which overlaps with a defect region, while maintaining an area ratio of a total area of the first portion to the total area of a second portion.

2. The method according to claim 1, wherein at least two of the functional regions formed in step c), which are each adjacent to the position of a defect region, differ from one another with respect to their geometric configuration.

3. The method according to claim 1, wherein at least one of the singulated semiconductor components comprises one of the defect regions and, during operation of the semiconductor component, a current flows within the semiconductor component, wherein the position of the defect region is circumvented.

4. The method according to claim 1, wherein the active region is removed in the at least one defect region or electrically isolated from the active region of an adjoining functional region.

5. The method according to claim 1, wherein the active region is structured laterally in step c) so that the active region in the at least one defect region is spatially separated from the active region of an adjoining functional region.

6. The method according to claim 5, wherein the lateral structuring of the active region takes place as a function of the position of the at least one defect region determined in step b).

7. The method according to claim 5, wherein the spatial separation of the defect region and a formation of an outer border of the active region of the semiconductor component take place in a common production step.

8. The method according to claim 1, wherein at least one electrical contact area is each formed on the semiconductor components, and the contact area is formed as a function of the position of the at least one defect region determined in step b) such that the contact area overlaps with the defect region.

9. The method according to claim 1, wherein the at least one defect region is determined by a measurement of a radiation emission under an optical excitation.

10. The method according to claim 1, wherein the substructure is designed in dependence of the determination of the at least one defect region such that the sub-regions are free of a defect region.

11. An optoelectronic semiconductor component comprising a semiconductor body comprising a semiconductor layer sequence having an active region that generates or receives radiation, wherein the semiconductor body comprises a plurality of functional regions and a defect region;

the active region of the defect region is electrically isolated from the active region of the plurality of functional regions on at least one side of the active region;

the semiconductor component comprises a plurality of image points;

at least one first image point and one second image point each comprise a substructure having a plurality of sub-regions; and the image points are individually segmented by the substructure;

a first portion of the sub-regions that generate radiation of a first color and a second portion of the sub-regions that generate radiation of a second color different from the first color are formed in each image point and the substructure of the first image point and the substructure of the second image point are designed such that a total area of the first portion of the first image point and a total area of the first portion of the second image point differ from each other by at most 10%.

12. An optoelectronic semiconductor component comprising a semiconductor body comprising a semiconductor layer sequence having an active region that generates or receives radiation, wherein the semiconductor body comprises the plurality of functional regions and the defect region;

the active region of the defect region is electrically isolated from the active region of the plurality of functional regions on at least one side of the active region, and at least two of the plurality of functional regions that are each adjacent to the defect region, differ from one another with respect to their contours, produced according to a method according to claim 1.

* * * * *